United States Patent [19]

Kausch

[11] 4,259,843

[45] Apr. 7, 1981

[54] ISOLATION CHAMBER FOR ELECTRONIC DEVICES

[75] Inventor: Marvin L. Kausch, San Jose, Calif.

[73] Assignee: Cromemco Inc., Mt. View, Calif.

[21] Appl. No.: 82,965

[22] Filed: Oct. 9, 1979

[51] Int. Cl.$^3$ .............................................. F25B 21/02
[52] U.S. Cl. ........................................................ 62/3
[58] Field of Search ............................................ 62/3

[56] References Cited

U.S. PATENT DOCUMENTS

| | | | |
|---|---|---|---|
| 3,018,631 | 1/1962 | Bury et al. | 62/3 |
| 3,168,816 | 2/1965 | Petrie | 62/3 |
| 3,194,023 | 7/1965 | Sudmeier | 62/3 |
| 3,234,595 | 2/1966 | Weichselbaum | 62/3 |
| 3,307,365 | 3/1967 | Townsend | 62/3 |
| 3,464,218 | 9/1969 | Buck | 62/3 |
| 3,733,836 | 5/1973 | Corini | 62/3 |
| 3,823,570 | 7/1974 | Wallace | 62/3 |

*Primary Examiner*—Lloyd L. King
*Attorney, Agent, or Firm*—Paul Hentzel

[57] ABSTRACT

The isolation chamber has an aluminum outer housing with heat transfer fins extending therefrom on the outside vertical surfaces, and insulation material mounted along each inside surface thereof forming a thermally insulative shell. Large aluminum studs extend inwardly from the side surfaces of the housing through the insulative shell for supporting a solid state heat pump. Each pump has a set of inwardly directed heat exchange fins. Each stud and associated pump and inwardly directed set of fins forms a heat conductive path between the surrounding ambient air and the interior of the isolation chamber for controlling the heat flow therebetween. The combined configuration of the inner heat exchange fins defines a central cavity which is temperature controlled to within a desired operating temperature range. A card cage containing the electronic devices is installed in the temperature regulated central region. The atmosphere within the central region is isolated from the surrounding ambient air, and supports internal convective heat transfer between the electronic devices and the inner fins by recirculating throughout the card cage and between the inner heat transfer fins. The operating level of the heat pumps are adjustable to provide the most efficient pumping as the external temperature varies. The outer housing and card cage form a double wall electrically conductive structure which twice encloses the electronic devices for providing double shielding from electrical interference. The card cage is cushioned from external vibration by the absorption affect of the insulative shell material.

21 Claims, 7 Drawing Figures

FIG 3
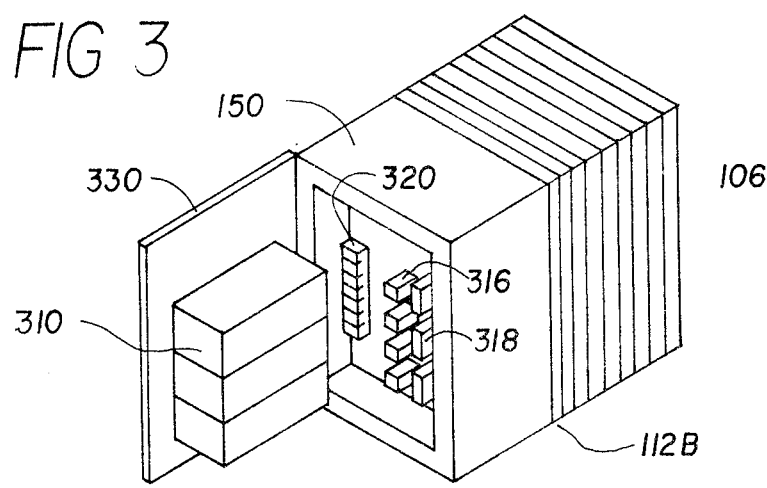
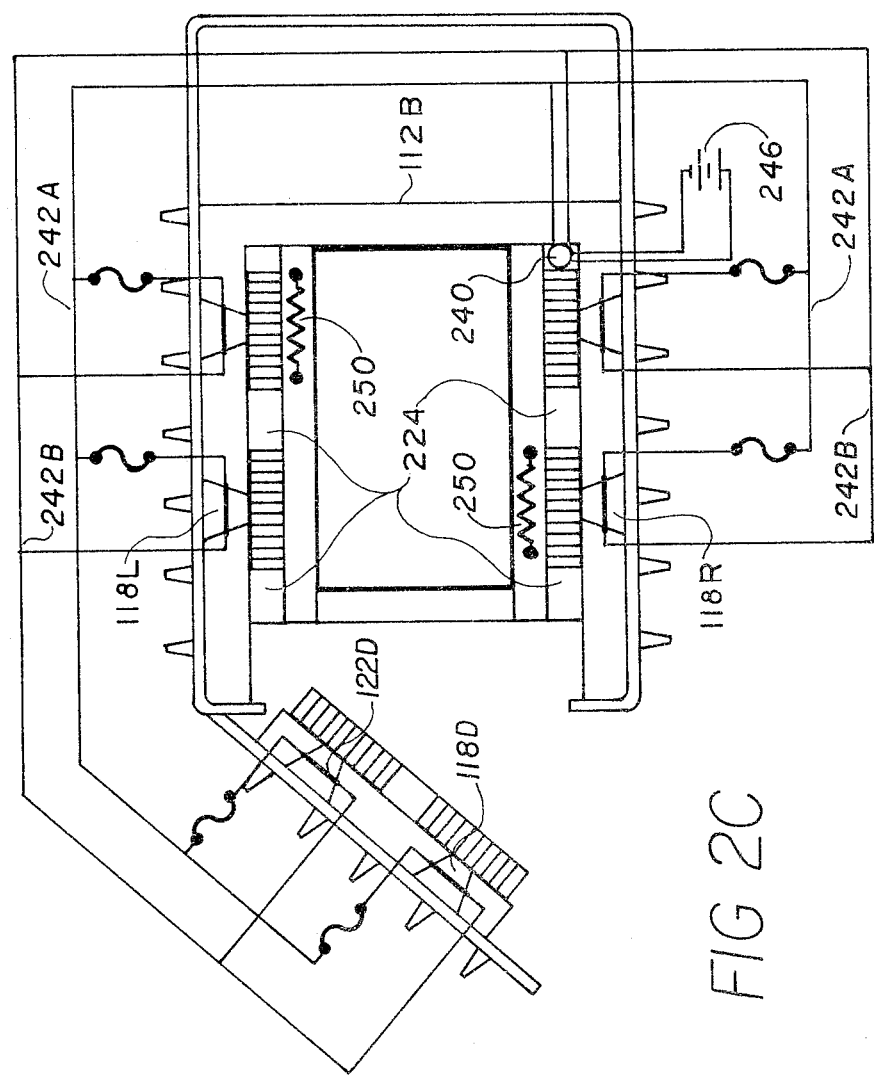
FIG 2C

_4,259,843_

ISOLATION CHAMBER FOR ELECTRONIC DEVICES

TECHNICAL FIELD

This invention relates to isolation chambers which provide an operating environment for electronic devices, and more particularly to such isolation chambers which regulate internal temperature without external convective heat transfer.

BACKGROUND ART

Heretofore, convection cooled isolation chambers and the like employed a cooling flow of external ambient air across the heat generating components within the chamber. The external air frequently contained foreign matter such as duct and other undesireable substances which were distributed throughout the chamber by the air flow, causing malfunctions of precision devices therein such as read-write heads.

The conventional isolation chamber systems which did not employ air flow cooling required an alternative form of cooling such as mechanical refrigeration. The compressor motors in these units generated undesireable electrical and acoustical noise. Further, the failure of a single element of the refrigerator system caused the entire system to fail. Standby refrigeration could not be provided by operational redundency in the system design without creating an entire parallel cooling system.

DISCLOSURE OF THE INVENTION it is therefore an object of this invention to provide an isolation chamber which does not require a convective flow of external air to supply heat to or remove heat from an electrical device therein.

It is a further object of this invention to provide an isolation chamber which maintains internal "clean" standards during the period of installation.

It is another object of this invention to provide an isolation chamber having heat pumps arranged in a functionally redundent design for standby operation.

It is an additional object of this invention to provide an isolation chamber with heat pumps having a variable level of operation.

It is yet another object of this invention to provide an isolation chamber with improved electrical shielding for operating sensitive electrical equipment therein.

It is still another object of this invention to provide an isolation chamber which absorbs external vibrations for preventing the displacement of delicate electrical equipment therein.

It is yet a further object of this invention to provide an isolation chamber which does not generate internal electrical or acoustical noise.

BASIC DESCRIPTION OF THE DRAWING

Further objects and advantages of the isolation chamber will become apparent to those skilled in the art from the following detailed description taken in conjunction with the drawing, in which:

FIG. 2C is a sectional top view of a dual mode isolation chamber showing a heat responsive switch for reversing the energizing voltage applied to the heat pumps;

FIG. 3 is an isometric view of the back of an isolation chamber showing the interface an power supply housing.

DETAILED DESCRIPTION

General Structure

Figures 1A, 1B:
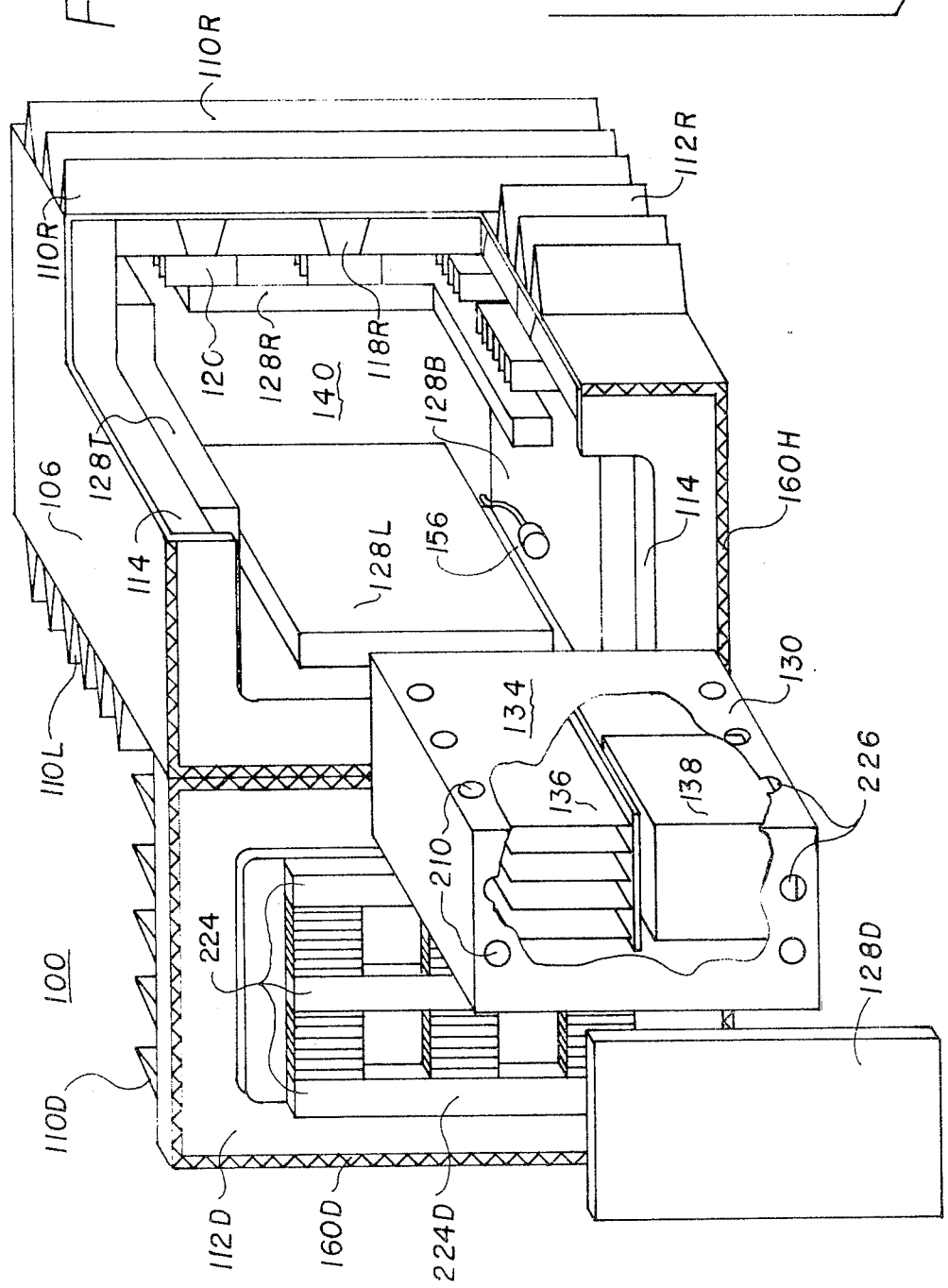
FIG. 1A is an isometric, broken away view of the isolation chamber showing the card cage in position for insertion.
FIG. 1B is a fragmentary, exploded view of a heat transfer module showing the Peltier heat pump.

Isolation chamber 100, shown in FIGS. 1 and 2, is formed by an outer shell or housing 106 having outer heat transfer fins 110L, 110R, and 110D extending from left side 112L, right side 112R, and access door 112D respectively. A thermally insulative layer 114 is mounted immediately inside outer shell 106 along each surface thereof for preventing uncontrolled heat transfer between isolation chamber 100 and the surrounding external environment. An array of six thermally conductive stand-offs or studs 118L, 118R, and 118D extend inwardly from each of sides 112L, 112R, and 112D respectively through insulative layer 114 for supporting a bank of six heat transfer modules on each of the sides. Each heat exchange module 120 (see FIG. 1B) is formed by a heat pump 122 in thermal contact with the end of the stud, a backplate 124 in thermal contact with the heat pump 122, and a vertical array of spaced inner heat transfer fins 126 in thermal contact with the backplate 124 and the atomsphere within the interior of isolation chamber 100. The six modules 120 forming each bank along each side are coplanarly positioned. A set of inner insulative sheets 128L, 128R, and 128D cover the fin side of each bank of modules 120 forming a series of adjacent vertical ducts each bounded by a backplate 124 on one side, two spaced fins 126 on opposed sides adjacent to backplate 124, and inner insulative sheet 128 on the remaining side. Additional inner insulative sheets 128T and 128B may be provided along the top and bottom of isolation chamber 100. An inner housing or card cage 130 containing a computer (134 including circuit boards 136 and disc drives 138) is inserted into a central cavity 140 defined by insulative sheets 128. Heat pumps 122 are serially mounted in the heat path between studs 118 and backplates 124 for moving heat between inner fins 126 and outer fins 110. Insulative shell 114 and insulative sheets 128 minimize heat leakage outside the heat conductive paths. Heat exchange modules 120 may be assembled and secured to the end of studs 118 by a suitable thermally conductive bonding agent. Alternatively, small bolts extending from backplate 124 to stud 118 may be employed to secure heat pump 122 in place. Heat leakage around heat pump 122 may be minimized by used small diameter bolts with insulative washers, or bolts formed of an insulative material.

A separate rear housing 150 (see FIG. 3) is provided to contain the computer interface circuitry 316 and 318 and the power supply 310 for computer 134 and heat pumps 122. Rear housing 150 is not temperature regulated, and is environmentally isolated from chamber 100 by back wall 112B of housing 106 and insulative shell 114. Power-data cable 156 passes through back wall 112B via a sealed port.

Cooling Cycle

The preferred operating temperature of conventional integrated circuit component 136 and disc drive 138 is from about 10 degrees C. to about 51 degrees C. In external environments having an ambient temperature varying from warm to cool, heat generated within card cage 130 by computer 134 must be removed as shown in FIG. 2A. The atmosphere within card cage 130 absorbs heat from computer 134 and expands causing an upward convection flow layer. The warm atmosphere spreads laterally and flows out through upper ports 210 into distribution passage 214 and enters the upper portion 218 of inner fins 126, which absorb heat from the atmosphere causing a slight contraction thereof. The cooling atmosphere developes a downward convection flow through the heat transfer ducts of modules 120, causing the cooling atmosphere to descend into lower distribution passage 220. The vertical space between adjacent columns of modules is filled by insulative columns 224. The cool atmosphere returns to card cage 130 through lower ports 226 and is reheated by computer 134. The heat sensitive disc drive 138 is mounted in the lower portion of card cage 130 in order to receive the maximum benefit of the cool atmosphere flow from lower ports 226. Circuit boards 136 are less sensitive to the temperature within card cage 130, and are therefore mounted in the upper portion and receive the flow of cool atmosphere after disc drive 138. Heat pumps 122 move the heat from backplate 124 to studs 118, where the heat conducts to outer fins 110 and is dissipated into the surrounding external environment which may have an ambient temperature greater than the operating temperature within card cage 130.

Warming Cycle

Figure 2B:
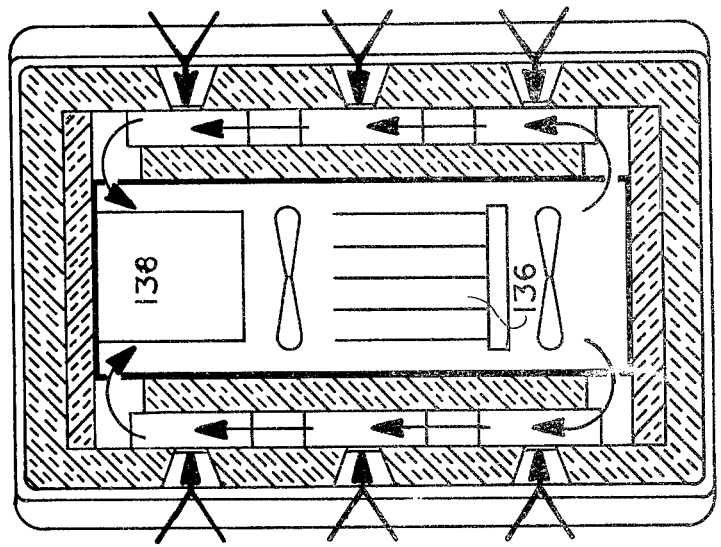
FIG. 2B is a sectional side view of an isolation chamber showing the internal convection currents during heating.
Figure 2A:
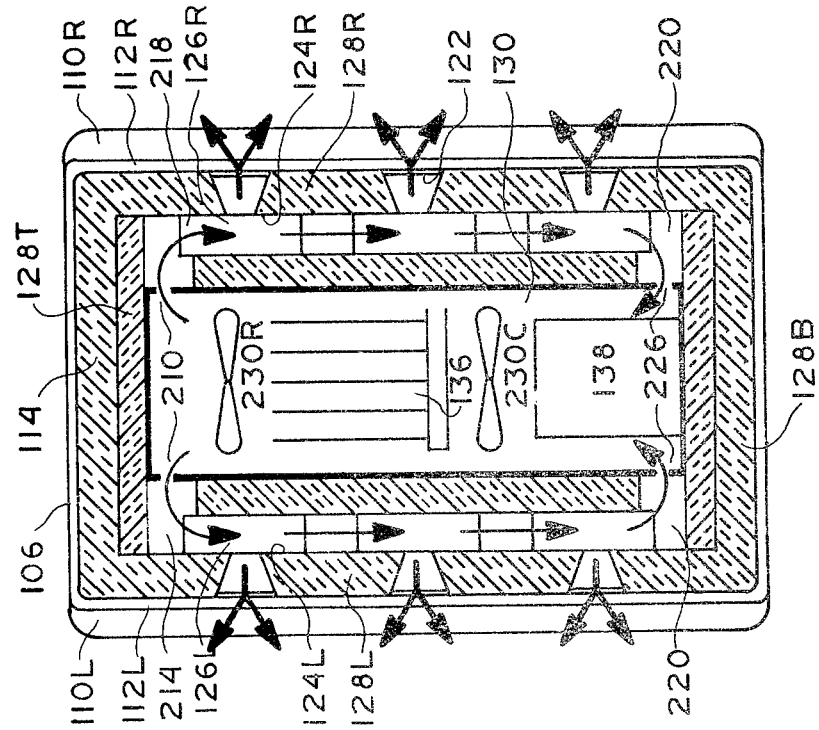
FIG. 2A is a sectional side view of an isolation chamber showing the internal convection currents during cooling.

In colder external environments, heat must be added to card cage 130 in order to maintain the preferred operating temperature for disc drive 138 and circuit boards 136, as shown in FIG. 2B. Heat from the external environment is absorbed by outer fins 110 and transferred to inner fins 126 via heat pump 122. The atmosphere within the ducts of heat transfer modules 120 absorb the heat and move upwards due to expansion. The upwards convection causes the warm atmosphere to enter upper distribution passage 214 and pass into card cage 130 via upper ports 210. Heat from the warm atmosphere is transferred to disc drive 138 and circuit boards 136, causing the atmosphere to contract and move downward into lower distribution passage 220 via lower ports 226. In cold climate applications, disc drive 138 is mounted in the upper portion of card cage 130 in order to receive the immediate benefit of the warm atmosphere flow. Circuits 136 occupies a secondary position in the lower portion of card cage 130.

The FIG. 2 embodiments employ a warming upward convection flow and a cooling downward convection flow for circulating the atmosphere within cavity 140 of isolation chamber 100. The thermal transfer efficiency of the cooling and heating cycles may be increased by forcing the internal atmosphere to flow with a suitable circulation device such as fan 230C. A reserve fan 230R may be employed to provide circulation in the event of fan 230C malfunction. The copper losses of the windings of fans 230 add to the heat load generated within card cage 130, and must be removed by heat pumps 122 along with the heat generated by computer 134. This copper loss heat load may be minimized by employing a forced circulation flow in a cooperating direction with the natural convection flow described in connection with FIGS. 2A and 2B. The heat loss may be further minimized by staggering the duty cycles of fans 230C and 230R. The copper losses thus generated are the same as if a single fan were employed, yet two fans are present to provide functional redundancy. Preferably the fans have a minimum blade - maximum port aerodynamic profile for minimizing "feather drag" while off.

The thermal transfer efficiency within cavity 140 may be further increased by employing an atmosphere having a higher specific heat and a larger coefficient of thermal expansion.

Heat Pump 122

The heat pump may be any suitable thermo-electric valve such as a Peltier device. Peltier heat pump 122 is a thin ceramic solid state unit, which when activated by a dc voltage, permits heat to flow unilaterally thereacross in the direction of the electric field. When deactivated, Peltier heat pump 122 assumes a partial insulative state which inhibits the return flow of heat back through the pump. The direction of the unilateral heat flow may be reversed by reversing the polarity of the applied voltage. Consequently, the cooling cycle employed during warm periods such as late morning and early afternoon to remove heat card cage 130, may be reversed during cold periods such as late evening and early morning to supply heat to card cage 130. FIG. 2C shows a thermally responsive controller 240 mounted proximate card cage 130 for controlling the duty cycle of heat pumps 122 in response to variations in the heat generation rate of computer 134 and to variations in the temperature of the surrounding environment. Thermal controller 240 may also reverse the polarity of the voltage leads 242A and 242B from dc souce 246 as applied to Peltier heat pumps 122 in response to daily or seasonal cold-warm patterns. If desired, thermal controller 240 may be mounted within card cage 130 or form an element of computer 134.

The operation of Peltier heat pump 122 requires a current flow therethrough which generates resistive heat losses. This resistive heat must be removed from isolation chamber 100 along with the load heat generated within card cage 130. The resistive heat losses within each heat pump 122 are a function of the square of the current therethrough, and may be minimized by operating the pumps almost continuously at the lowest current level permitted by the heat load. The long on-short off duty cycle also minimizes the off period during which heat may leak back through the moderately conductive ceramic material of the heat pump.

In warm climate applications requiring cooling of card cage 130, the resistive heat may be more readily dissipated by outer fins 110, if heat pump 122 is mounted on the outer end of stud 118 as shown in FIG. 2A. In cold climate applications requiring heating of card cage 130, the resistive heat may be pumped into card cage 130 along with the heat taken from the surrounding air via outer fins 110. The resistive heat will be more effective as a heat source for card cage 130 if heat pump 122 is mounted on the inner end of stud 118 as shown in FIG. 2B. Additional internal heat sources such as heating elements 250 may be employed within cavity 140 as shown in FIG. 2C. Placement of heat pumps 122 in the middle of stud 118 is suitable for cooling-heating applications.

Interface and Power Supply

Rear housing 150, shown in FIG. 3, contains ferroresonant power supply 310 for providing power to computer 134, heat pumps 122, and fans 230. Rear housing 150 also contains I/O modules 316 and relays 318 for interfacing with conventional I/O devices and process control apparatus. Terminal strip 320 provides connection for cable 156 which extends through back side wall 112B between rear housing 150 and the isolation chamber housing 106 for power distribution and data flow therebetween (see FIG. 1). Rear housing 150 is environmentally separate from isolation chamber 100, and does not require temperature regulation. The heat generated by power supply 310 is independently dissipated through rear housing hatch 330, and does not contribute to the heat load which must be removed from isolation chamber 100. Foreign matter entering rear housing 150 during interface procedures can not enter isolation chamber 100 to contaminate disc drive 138.

Functionally Redundant Design

Heat pumps 122 are arranged in three banks of six modules each to provide functional redundancy. Each bank may be failure isolated from the other banks by a suitable fuse device. If a module 120 in any of the banks fails in short or open mode, the other two banks continue to provide temperature regulation at two-thirds capacity. The modules may be arranged in six banks of three, or nine banks of two, or individually isolated by fuse 260 as shown in FIG. 2C, in accordance with the redundancy factor required. Each module 120 is a separate and complete heat transfer unit which may be operated or deactivated independently of the other modules, in contrast with prior art mechanical type refrigeration system which is not functionally redundant and must be controlled as a single unit.

Modules 120 may be arranged in progressively activated mixed banks in which each bank has modules on more than one side. At low heat transfer requirements, only one bank of modules is required to be activated. The current to the activated bank may be optimized to provide the most efficient heat transfer. At higher heat transfer requirements, additional banks of modules may be activated as required to maintain temperature regulation at the optimum current through heat pumps 122.

Double Shielding

Computer 134 is surrounded by two electrically conductive enclosures, an outer enclosure housing 106, and an inner enclosure card cage 130; which form a double electrostatic shield against radio-frequency interference and high frequency transients. In addition, the periphery of housing door 112D is provided with conductive rfi gasket tape 160D and the door frame on housing 106 is provided with a cooperating conductive rfi gasket tape 160H which engages tape 160D to create an electrostatic seal around the door 112D-housing 106 interface.

The above shielding provisions isolate chamber 100 from nearby data transmissions, motor and generator noise, jamming etc. associated with industrial applications. Computer 134 is also protected against electrical disturbances generated by electrical storms, the electrolytic bath affect of salt water waves in an electrically active environment, and other static discharges and transient voltage spikes inherent in field conditions.

Vibration Isolation

Disc drive 138 within card cage 130 is mechanically isolated from machine vibration, wind motion, and other physical disturbances, by a cushion nest completely surrounding card cage 130. The cushion on the left, right, and door sides of card cage 130 is formed by inner insulative sheets 128L, 128R and 128D. The cushion on the back side of card cage 130 is formed by the back portion of insulative shell 114. A double cushion is formed along the top and bottom surfaces of card cage 130 by the top and bottom portions of insulative shell 114 in combination with upper and lower insulative sheets 128T and 128B. The insulative material is resilient and absorbs vibration energy to create the cushion effect. The cushion reduces read and write errors generated by spurious acceleration of read-write had in disc drive 138. Without the cushion nest, external vibrations would be transmitted through the structure of isolation chamber 100 to the read-write head.

150 WATT EMBODIMENT

The dimensions and circuit parameters for an isolation chamber having a 150 watt heat generation load (computer plus disc drive) and an operating range of between 10 degrees C. and 51 degrees C. are:

outer shell 106: 24.5" (62.23 cm) high, 16.75" (42.54 cm) wide, 30" (76.2 cm) deep; with 82 heat transfer fins 1.25" (3.175 cm) deep spaced along the left, right, and door sides 0.56" (1.42 cm) apart.

insulative shell 114: 2" (5.08 cm) of closed polyurethane foam.

Peltier heat pumps 122: three parallel connected banks of six parallel connected heat pumps mounted on left, right and door sides, each heat pump having a heat transfer area of 2.89 square inches (18.6 cm$^2$) on each side, and a power consumption of 8.88 amps at 2.52 volts per heat pump.

backplate 124: 3" (7.62 cm) high, 4" (10.16 cm) wide with 40 vertical fins 1" (2.54 cm) deep.

insulation sheets 128: 0.5" (1.27 cm) thick of closed cell polyurethane foam.

card cage 130: 11.5" (44.45 cm) high, 6$\frac{3}{8}$" (16.2 cm) wide, and 9.75" (24.76 cm) deep.

CONCLUSION

It will be apparent to those skilled in the art that the objects of this invention have been achieved by providing a series of independent solid state heat pumps around a central cavity for regulating the temperature therein. The heat pumps are connected in banks to provide for standby cooling capability in the event of a malfunction of an individual heat pump in one of the banks. The electronic device within the isolation chamber is double enclosed in electrical conductive and thermal insulative material to reduce external electrical interference and to minimize heat leakage transfer.

Figure 4:
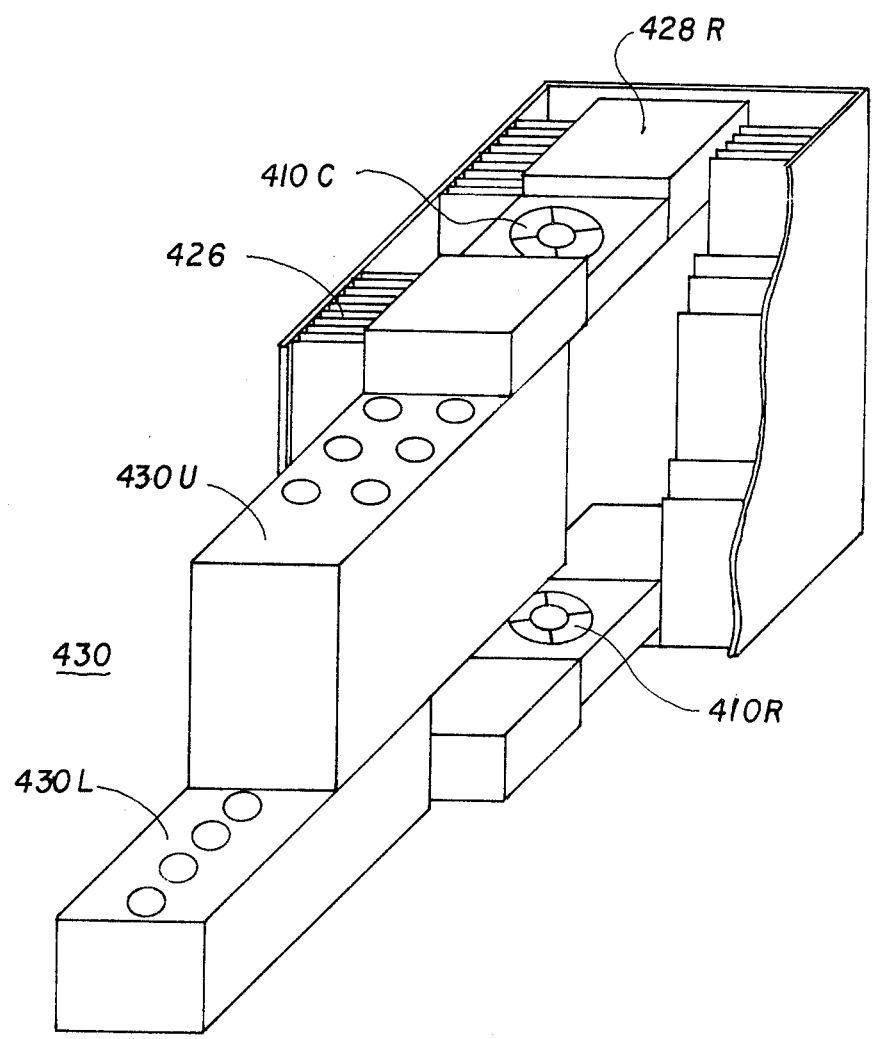
FIG. 4 is a fragmentary isometric view showing a modified card cage central region.

Additional changes and modifications may be made in the disclosed embodiments without departing from the scope of the invention. For example, as shown in FIG. 4, the fans 410C and 410R may be mounted above and below the housing 430, without forming part of the housing itself. Spacer pads 428F and 428R in front of an behind fans 410 are formed of resilient, insulative material for supplimenting the cushioning effect of outer insulative shell 114. The inner insulative sheets 128F, 128R, and 128D have been eliminated to provide a direct heat transfer path between the outer surface of housing 430 and the internal atmosphere and the inner heat exchange fins 426. Housing 430 has a separate upper compartment 430U for the circuit boards, and another separate compartment 430L for the disc drives. These compartments 430U and 430L may be removed and inserted independently. Therefore, the scope of the invention is to be determined by the terminology of the following claims and the legal equivalents thereof.

I claim as my invention:

1. An isolation chamber for providing a controlled environment for an electronic device, comprising:

a rigid outer support shell formed of thermally conductive material with outer heat exchange means exposed to the external environment;

a plurality of inner heat exchange means positioned inside the isolation chamber defining a temperature controlled central region for receiving the electronic device;

thermal insulation means positioned inside the isolation chamber between the outer support shell and the inner heat exchange means;

a plurality of thermally conductive standoff means extending from the outer shell through the insulation means to the plurality of inner heat exchange means forming a plurality of heat conductive paths therebetween;

a plurality of heat pump means, one positioned in each of the plurality of heat paths for controlling the temperature of the central region by supporting heat flow along the conductive paths when energized and inhibiting heat flow along the conductive paths when not energized;

an internal atmosphere within the central region for supporting convection heat currents which transfer heat between the electronic device and the inner heat exchange means;

circulation means within the central region for moving the internal atmosphere therein; and power means for providing electric power to the electronic device and to the heat pumps.

2. The isolation chamber of claim 1, wherein the heat pumps are solid state devices.

3. The isolation chamber of claim 2, further comprising a thermal controller responsive to the temperature within the isolation chamber for controlling the operation of the solid state heat pumps.

4. The isolation chamber of claim 3, wherein the thermal controller controls the duty cycle of the solid state heat pumps to regulate the temperature within the central region.

5. The isolation chamber of claim 3, wherein the pumping level of the solid state heat pumps is variable as a function of the power applied thereto.

6. The isolation chamber of claim 5, wherein the thermal controller controls the power applied to the solid state heat pumps to determine the pumping level thereof and regulate the temperature within the central region.

7. The isolation chamber of claim 6, wherein the thermal controller minimizes the power applied to the heat pumps in response to the temperature within the isolation chamber to operate the solid state heat pumps at the lowest pumping level and longest on time permitted by the thermal requirements of the isolation chamber.

8. The isolation chamber of claim 1, wherein the heat pumps are connected to the power means in banks of at least one.

9. The isolation chamber of claim 8, wherein each bank of pumps is separately fused to the power means.

10. The isolation chamber of claim 1, further comprising an inner housing shell enclosing the central region for housing the electronic device.

11. The isolation chamber of claim 10, wherein the inner housing shell is removable from the central region for housing the electronic device when the electronic device is removed from the isolation chamber.

12. The isolation chamber of claim 10, further comprising a layer of resilient material positioned between the inner heat exchange means and the inner housing shell.

13. The isolation chamber of claim 12, wherein the resilient material is compressed outwardly by the insertion of the inner housing shell into the central region for securely retaining the inner housing shell and the electronic device therein.

14. The isolation chamber of claim 10, wherein the outer support shell is made of an electrically conductive material and is connected to a reference potential means for shielding the interior of the isolation chamber from external electro-magnetic radiations.

15. The isolation chamber of claim 14, wherein the inner housing shell is made of an electrically conductive material and is connected to a reference potential means for shielding the interior of the central region from electro-magnetic radiations.

16. the isolation chamber of claim 15, wherein the outer support shell and the inner housing shell are connected to a common reference potential.

17. The isolation chamber of claim 16, wherein the common reference potential is the ground potential of the surrounding environment.

18. The isolation chamber of claim 1, wherein:

the circulation means is the expansion and upwards motion of the internal atmosphere as it absorbs heat from that portion of the surrounding structure which is warmer than the internal atmosphere, and the contraction and downwards motion of the internal atmosphere as it releases heat to that portion of the surrounding structure which is cooler than the internal atmosphere; and The circulation means causes the internal atmosphere to move vertically through the electronic device in one direction and then vertically through the inner heat exchange means in the other direction and then return to the electronic device.

19. The isolation chamber of claim 18, wherein the the circulation means additionally comprises a fan means for supporting the motion of the internal atmosphere vertically through the electronic device in the one direction and vertically through the inner heat exchange means in the other direction.

20. The isolation chamber of claim 1, wherein the circulation means is a rotary fan means for causing the internal atmosphere to circulate between the electronic device and the inner heat exchange means.

21. the isolation chamber of claim 20, wherein the fan means is a first and second fan having staggered duty cycles for alternately causing the internal atmosphere to circulate.

* * * * *